United States Patent [19]

Mitchell

[11] 4,336,568

[45] Jun. 22, 1982

[54] PACKAGED SOLID STATE POWER CONTROLLER WITH SEPARABLE MOUNTING FOR A POWER SWITCHING DEVICE, AND METHOD OF ASSEMBLY

[75] Inventor: James T. Mitchell, Lima, Ohio

[73] Assignee: Westinghouse Electric Corp., Pittsburgh, Pa.

[21] Appl. No.: 171,608

[22] Filed: Jul. 24, 1980

[51] Int. Cl.³ ............................................. H05K 7/20
[52] U.S. Cl. .................................... 361/386; 361/388
[58] Field of Search .................... 357/81; 174/16 HS; 361/380, 381, 331, 382, 386–389

[56] References Cited

U.S. PATENT DOCUMENTS

| 3,801,874 | 4/1974 | Stefani | 361/388 |
| 4,172,272 | 10/1979 | Schneider | 361/386 |
| 4,278,990 | 7/1981 | Fichot | 357/81 |

Primary Examiner—Gerald P. Tolin
Attorney, Agent, or Firm—G. H. Telfer

[57] ABSTRACT

A separable plate is utilized for mounting isolated case-type power switching devices for easy replacement in a solid state power controller while providing increased heat transfer in the assembled unit.

6 Claims, 3 Drawing Figures

PACKAGED SOLID STATE POWER CONTROLLER WITH SEPARABLE MOUNTING FOR A POWER SWITCHING DEVICE, AND METHOD OF ASSEMBLY

BACKGROUND AND SUMMARY OF THE INVENTION

This invention relates to solid state power controllers and, more particularly, to the physical arrangement and method of assembly of controllers in which the main switching function is performed by a solid state switching device mounted in a manner to permit maximum heat transfer in operation and ease of replacement.

Solid state power controllers of the type to which the invention applies are generally characterized by a combination of circuit elements that perform preselected operations between a supply and a load where there may be currents of several amperes or more. The main switching function in most such power controllers, including those sometimes referred to as solid state circuit breakers or solid state relays, are performed by power SCRs although other forms of solid state switching devices may be employed. Among the several requirements of such units are that they be compact because of the necessity to mount them, sometimes in large numbers, in a limited space, such as in aerospace applications. The fact that they carry load current and are in a confined space results in the requirement that special attention be given to heat generated in the devices. This may be difficult because the SCR or other switching device may not conveniently be on a stud or flange mounting, which would provide good heat dissipation, because of insufficient room. Thus, space limitations may dictate the use of SCRs of the isolated case type in which the case of the SCR is electrically at anode potential and must be electrically isolated from its support structure. SCRs of this type are sometimes referred to as the "press in" type.

The power controller unit as a whole is housed in an enclosure of box-like configuration in which one or more encased SCRs are mounted. The box also encloses additional circuit elements that tailor the response of the main switching device according to any electrical parameters (e.g. overcurrent or overvoltage) as required by the system in which it is applied. These additional elements may be mounted on one or more printed circuit boards. The resulting unit may be entirely potted with a material such as an epoxy resin to provide assurance of reliable mechanical support and electrical insulation throughout. Examples of solid state power controllers which may be so assembled are those described in copending Applications Ser. No. 023,361 and Ser. No. 023,368, respectively by W. W. Billings and R. E. Luebrecht and by J. T. Mitchell and W. W. Billings, both filed Mar. 23, 1979 and both assigned to the present assignee now respectively U.S. Pat. Nos. 4,245,184 and 4,245,185, issued Jan. 13, 1981. The present invention will be described generally with reference to the mechanical configuration of such power controllers which may employ various kinds of circuit arrangments which will not be detailed herein.

In prior solid state power controllers of the general type described, it has been a practice to attach the SCRs, of the enclosed case type, to an inner surface of the metal box-like enclosure with an adhesive such as an epoxy resin. This has several drawbacks because heat transfer through the adhesive material is limited to a relatively low amount and such materials are not of high insulation quality. Necessarily, the more adhesive material is applied for satisfactory electrical insulation, the worse the thermal problems become. Because of the high thermal drop across the adhesive, it may be necessary to limit the current employed in units of such construction to a few amperes.

It is also known that the SCRs may be soldered to the housing wall using a metallized disc of beryllia for electrical isolation. This provides good heat transfer but makes it very difficult to remove a faulty SCR after testing because accessibility to the SCR may be too limited.

By way of further background, reference is made to U.S. Pat. No. 4,172,272, Oct. 23, 1979, which has to do with a form of solid state relay package in which the main switching device is carried on a conductive ceramic base that is fixed to the interior of the housing by cementing or soldering.

What is desired is a structural configuration and method of assembly of a solid state power controller that takes into account the multiple aspects of required heat transfer capability, electrical isolation, and ease of assembly and disassembly of the power switching device.

In accordance with the present invention, briefly, a solid state power controller is provided that generally comprises a box-like housing. The SCRs or other power switching devices are not mounted directly to a surface of the housing but rather are mounted on a metallic plate subassembly. This is preferably performed by soldering the case of the SCR to the metal plate using a thermally conductive, electrically insulating layer, such as a beryllia ceramic disc, to provide insulation and excellent heat transfer characteristics. This plate is then held against the inside of the front face of the enclosure. This provides a temporary type of assembly in which the plate subassembly is only lightly held with the front face such as by use of the body of a toggle switch, normally provided on the front face, as a supporting medium. Thus, in this stage the plate can be removed, and SCRs replaced, conveniently and expeditiously.

DESCRIPTION OF THE PREFERRED EMBODIMENT

Figure 1:
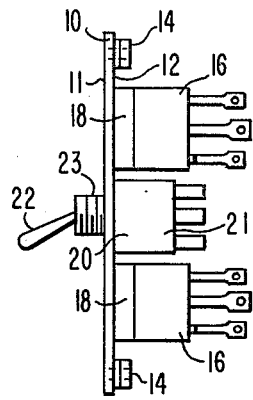
FIG. 1 is a side elevation view of a subassembly for a power switching device mounting in accordance with an embodiment of the present invention.
Figure 3:
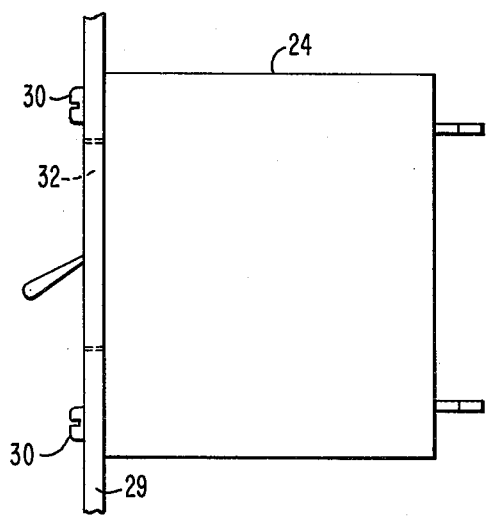
FIG. 3 is a side elevation view of a completed and mounted solid state power controller in accordance with FIG. 2.

Referring to the drawing, FIG. 1 shows a subassembly including a metal plate 10 of generally rectilinear configuration having major front and rear surfaces 11 and 12. The plate 10 may be a sheet of material such as copper or aluminum and is preferably lightweight and has good thermal conductivity. Copper is preferred for closer matching of the thermal expansion characteristics of the SCRs. Proximate the upper and lower extremities of the rear surface of the plate are mounted nut plates 14 having apertures aligned with fastener receiving apertures in the plate itself. The apertures in the nut plates 14 are internally threaded to receive screws or bolts 30 mounting the complete device to a metal panel as shown in FIG. 3.

At the stage shown in FIG. 1, the plate 10 subassembly has joined to its rear surface 12 a pair of SCRs 16 or other power switching devices which are of the enclosed case type and have terminals extending rearwardly therefrom. The SCRs 16 are joined to the metal plate 10 by means such as a metallized beryllium oxide disc 18 and soldering is performed, such as by reflow soldering, both to bond each SCR 18 to disc 18 and the disc to the plate.

Additionally, a toggle switch 20 is shown that extends through a central aperture in the plate 10 and has a body portion 21 on the rear surface of the plate and a manually actuated switch handle 22 on the front of the plate. The toggle switch is held in place on the plate by nut fastener means 23.

Figure 2:
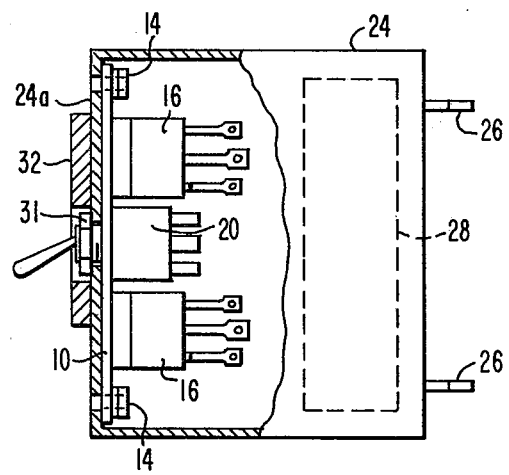
FIG. 2 is a side elevation view, partially broken away, of a solid state power controller incorporating the subassembly of FIG. 1.

FIG. 2 shows the plate-SCR subassembly in position in a power controller unit. The working elements of the unit are enclosed in a metal box-housing 24 that has rearwardly extending terminals 26. In assembly, a side surface would be open to permit placing components within the housing. Various components 28 are mounted in place on one or more printed circuit boards or the like in the inner portion of the enclosure 24. Interconnections (not shown) between the elements 16, 20, 26 and 28 form a power controller circuit such as one of those described in the referred to copending applications. The plate-SCR subassembly is in place against the front surface of the enclosure 24 and is held in place, at this stage, by the toggle switch 20 extending through an aperture in the front surface 24a of enclosure 24.

At the stage shown in FIG. 2, the SCRs 16 are easily replaceable by removing electrical connections between them and the unit terminals 26 and/or the electronic components 28. Upon removal of the electrical connections, it is then merely necessary to remove the toggle switch 20 which leaves the plate 10 with the SCRs attached as a separate replaceable unit or an individual SCR may be removed and replaced.

Thus, the assembly as shown in FIG. 2 can be completed through all its wiring connections and tested. Before final potting with an epoxy resin or before assembly into a panel as shown in FIG. 3, the performance of the SCRs can be judged and, if need be, they can be readily replaced without jeopardizing other elements.

This arrangement is beneficial whether the unit is to be potted or not. If the unit is potted, it is customary to install screws in the nut plates 14 to prevent the leakage of potting material through the mounting holes. Then these same screws, if their length is chosen properly, can be used by tightening them properly to snug the plate against the front face 24a of the complete device.

FIG. 2 also shows a cover element 32 that fits over the toggle switch nut 31 for appearance benefits and also to serve as a pilot or locator for mounting the unit in a panel. In the latter purpose the cover 32 is off center in the front face of the unit.

FIG. 3 shows the final mounting arrangement in a panel 29. Screws or other fasteners 30 penetrate the panel in which the unit is mounted and also the enclosure 24 and plate 10 before engaging the threads of the nut plates 14. When the mounting screws are tightened, the plate-SCR subassembly is clamped firmly against the front face of the complete device which is in turn clamped against the mounting panel which also serves as the major heat sink of the unit. This gives excellent heat transfer from the SCR devices 16 to the heat sink 29.

It is thus seen that the assembly technique provided has among its significant elements the bonding, preferably by soldering, of isolated case-type SCRs to a metal plate to form a subassembly and the assembly of this subassembly lightly in place, to the front face of the complete device, such that it can be easily removed for replacement of failed SCRs, with the resulting configuration that insures adequate heat dissipation qualities.

Assemblies as described have been made and evaluated for the temperature rise of the SCRs. A 75% improvement was observed as compared to that characterized in the background where the SCRs are adhesively bonded to a wall of the enclosure. The rise of SCR junction temperature above the mounting panel was one-fourth of that observed on older designs.

The combinational benefits of the arrangement include the utilization of a separable plate for mounting the SCRs that is easily installed and readily replaced. By locating the subassembly adjacent to and in immediate contact with the back of the mounting face, excellent heat transfer is obtained. By attaching the nut plates to the plate-SCR subassembly and utilizing the toggle switch body to hold it in position, no new hardware elements are required. Rigidity is achieved when the mounting screws are used to secure the complete unit to a mounting panel.

It will be appreciated that arrangements in accordance with this invention and methods of assembly may be modified from those shown and described by way of example.

I claim:

1. A solid state power controller assembly comprising:
    a box-like housing of thermally conductive material having a front wall, a rear wall, and side walls;
    a plurality of electrically operative circuit elements contained by and mounted within said housing;
    means for interconnection of said circuit elements and for connection of said circuit elements with terminals extending through a wall of said housing;
    said circuit elements including a solid state power switching device that is enclosed in a case;
    a metal mounting plate that is a separate element from said walls of said housing;
    said switching device case being bonded to a layer of electrically insulating and thermally conducting material which is bonded to said mounting plate; and
    said mounting plate being joined by primary fasteners flat against the inner surface of said housing front wall.

2. A solid state power controller assembly in accordance with claim 1 wherein:
    the bonds between said layer of electrically insulating and thermally conducting material and said switching device case and said mounting plate, respectively, are of a metallic solder material.

3. A solid state power controller assembly in accordance with claim 2 wherein:
    said circuit elements further include a toggle switch device mounted with a body portion on the rear surface of said mounting plate and a switch handle on the front of said housing front wall and said toggle switch device is held in place by an additional mechanical fastener accessible from the front of said housing front wall.

4. A solid state power controller assembly in accordance with claim 3 wherein:
said front wall of said housing is disposed against a surface of a heat sink panel and said primary fasteners extend through said panel, said front wall and said mounting plate forming an assembly having a direct thermally conductive path from said switching device case to said panel through said electrically insulating and thermally conducting material and its solder bonds, said mounting plate, and said front wall.

5. A solid state power controller assembly in accordance with claim 4 wherein:
said toggle switch device has an asymmetrical cover over said additional mechanical fastener and said cover mates with an opening in said heat sink panel.

6. A method of assembling a packaged solid state power controller comprising:
mounting at least one solid state power switching device on a metallic plate by soldering the case of the switching device thereto with an intermediate insulating layer;
locating said metallic plate, with said switching device thereon, immediately adjacent the front inner surface of a box-like power controller enclosure to form a subassembly;
fastening said metallic plate immediately adjacent the front face of said enclosure by one or more fasteners;
testing said power controller to confirm the operability of said power switching device while said metallic plate is fastened to said enclosure;
potting, after said testing, of said enclosure with a resin;
locating, after said potting, said power controller enclosure with the front surface thereof adjacent a heat sink panel; and,
joining by one or more fasteners said panel, said enclosure front surface, and said metallic plate to provide a direct thermal path from said device case to said heat sink panel.

* * * * *